(12) United States Patent
Hsu et al.

(10) Patent No.: US 6,784,081 B1
(45) Date of Patent: Aug. 31, 2004

(54) GATE STRUCTURE FORMING METHOD OF FIELD EFFECT TRANSISTOR

(75) Inventors: Chin-Tsai Hsu, Tainan (TW); Chi-Jui Chen, Hsinchu (TW); Pang-Miao Liu, Hsinchu Hsien (TW)

(73) Assignee: Suntek Compound Semiconductor Co., Ltd., Hsinchu (TW)

( * ) Notice: Subject to any disclaimer, the term of this patent is extended or adjusted under 35 U.S.C. 154(b) by 0 days.

(21) Appl. No.: 10/604,628

(22) Filed: Aug. 6, 2003

(51) Int. Cl.[7] .......................... H01L 21/28; H01L 21/44
(52) U.S. Cl. ................ 438/574; 438/577; 438/579; 438/951
(58) Field of Search .................... 438/163, 167, 438/172, 180, 182, 183, 574, 579, 577, 951

(56) References Cited

U.S. PATENT DOCUMENTS

| | | | | |
|---|---|---|---|---|
| 4,700,462 A | * | 10/1987 | Beaubien et al. | 438/574 |
| 4,889,827 A | * | 12/1989 | Willer | 438/180 |
| 4,963,501 A | * | 10/1990 | Ryan et al. | 438/183 |
| 5,766,967 A | * | 6/1998 | Lai et al. | 438/167 |
| 6,042,975 A | * | 3/2000 | Burm et al. | 430/22 |
| 6,255,035 B1 | * | 7/2001 | Minter et al. | 438/579 |
| 6,524,937 B1 | * | 2/2003 | Cheng et al. | 438/574 |
| 6,534,351 B2 | * | 3/2003 | Muller et al. | 438/182 |
| 6,674,139 B2 | * | 1/2004 | Mandelman et al. | 257/412 |
| 6,711,723 B2 | * | 3/2004 | Tsai et al. | 716/4 |

* cited by examiner

*Primary Examiner*—John F. Niebling
*Assistant Examiner*—Walter L Lindsay, Jr.
(74) *Attorney, Agent, or Firm*—Jiang Chyun IP Office

(57) ABSTRACT

A method of forming a gate structure includes forming sequentially a pad layer and a first photoresist layer over a substrate. A cross-linked surface layer is formed on the surface of the first photoresist layer, followed by rounding the profile of the first photoresist layer, and removing the exposed pad layer to expose the substrate. A second photoresist layer is formed over the first photoresist layer, wherein a portion of the first photoresist layer and the exposed substrate are exposed by the second photoresist layer. Thereafter, a conductive layer is formed, wherein the conductive layer formed on the second photoresist layer is separated from the conductive layer formed on the first photoresist layer and the exposed substrate. The first and the second photoresist layers are removed while the conductive layer on the second photoresist layer is concurrently being striped. The remaining conductive layer serves as a gate structure.

19 Claims, 8 Drawing Sheets

GATE STRUCTURE FORMING METHOD OF FIELD EFFECT TRANSISTOR

BACKGROUND OF INVENTION

1. Field of the Invention

The present invention relates to a fabrication method for a semiconductor device. More particularly, the present invention relates to a fabrication method for a gate structure of field effect transistor (FET).

2. Description of Related Art

The metal semiconductor field effect transistor (MESFET) or the high electron mobility transistor (HEMT) is a microwave device. In order to increase the operation frequency and efficiency, reducing the gate length and suppressing the signal noise are feasible approaches. However, as devices enter the sub-micron stage, the resistance of the gate increases as the gate length reduces. In order to overcome the aforementioned problem, a T-shaped gate structure technique is widely used. Further, simpler manufacturing techniques are also being developed.

FIGS. 1A to 1D are schematic, cross-sectional diagrams illustrating a process flow for fabricating a T-shaped gate structure according to the prior art.

Referring to FIG. 1A, a photoresist layer 102 and a photoresist layer 104 are formed on a substrate 100. An electron beam exposure process 106 is then conducted on the photoresist layer 102 and the photoresist layer 104, wherein the energy of the main beam 106a is greater than the energy of the side beam 106b.

Referring to FIG. 1B, a two-step development process is conducted to form the patterned photoresist layer 102a and the patterned photoresist layer 104a, wherein at the region where the electron beam 106a (higher energy) is directed to, both photoresist layers 102a, 104a are being developed, whereas at the region where the electron beam 106b (lower energy) is directed to, only the photoresist layer 104a is being developed.

Referring to FIG. 1C, a metal evaporation deposition process is conducted to form a metal layer 108 on the exposed surface of the substrate 100 and on the photoresist layers 102a, 104a, wherein the metal layer 108a that is formed on the substrate 100 surface and the photoresist layer 102a is separated from the metal layer that is formed on the photoresist layer 104a.

Continuing to FIG. 1D, the photoresist layers 102a, 104a are removed. Concurrently, the metal layer 108b is also being striped, leaving only the metal layer 108a to form a T-shaped gate structure.

However, in the aforementioned method, the fabrication of the gate structure requires the application of the electron beam development process. The manufacturing cost is thus higher and a lower throughput is resulted (1 to 2 wafer per hour). Further, seam may be generated on the surface of the subsequently formed metal layer (gate structure) when the rounding of the lower photoresist layer profile is not sufficient. The reliability of the device is thus affected.

FIGS. 2A to 2D are schematic, cross-sectional diagrams illustrating a process flow for fabricating another type of gate structure.

As shown in FIG. 2A, a patterned silicon nitride layer 202 is formed on a substrate 200, exposing a part of the substrate 200. A photoresist layer 204 is then formed over the silicon nitride layer 204.

Referring to FIG. 2B, a photolithography process is conducted to pattern the photoresist layer 204 to form the photoresist layer 204a. The photoresist layer 204a exposes a part of the silicon nitride layer 202 and a substrate 200 surface exposed by the silicon nitride layer 202.

Continuing to FIG. 2C, a metal evaporation deposition process is conducted to form a metal layer 206 on the photoresist layer 204a, the exposed silicon nitride layer 202 and the substrate 200 surface, wherein the metal layer 206b formed on the photoresist layer 204a is separated from the metal layer 206a on the silicon nitride layer and the substrate 200 surface.

Referring to FIG. 2D, the photoresist layer 204a is removed. Concurrently, the metal layer 206b is striped, leaving only the metal layer 206a to serve as a T-shaped gate structure.

However, when a gate structure is formed with the above methods, parasitic capacitance is formed between the gate, the silicon nitride layer and the substrate due to a direct contact between the top surface of the silicon nitride layer and the substrate. The presence of a parasitic capacitance lowers the cutoff frequency and the maximum transition frequency. As a result, noise interference increases during the operation of the device.

SUMMARY OF INVENTION

Accordingly, the present invention provides a fabrication method for a gate structure, wherein the deficiencies in the conventional manufacturing method for a T-shaped gate structure, for example, high cost and low yield, are resolved.

The present invention also provides a fabrication method for a gate structure, wherein the generation of parasitic capacitance at the gate formed according the conventional manufacturing method for a T-shaped gate structure is resolved.

The present invention further provides a fabrication method for a metal semiconductor field effect transistor, wherein the reliability of a device is improved and a better operation efficiency is resulted.

The present invention provides a fabrication method for a gate structure, wherein a pad layer is formed on a surface of a substrate. A patterned first photoresist layer is formed on the pad layer, wherein the patterned first photoresist layer exposes the pad layer. An ultra-violet curing step is conducted to form a cross-linked layer at the surface of the first photoresist layer. Thereafter, a rounding step is conducted for rounding the profile of the first photoresist layer. The pad layer that is not covered by the first photoresist layer is then removed to expose a surface of the substrate. A patterned second photoresist layer is then formed on the first photoresist layer, wherein the second photoresist layer exposes a part of the first photoresist layer and the substrate surface that is being exposed by the first photoresist layer. A deposition step is conducted to form a conductive layer on the second photoresist layer, the first photoresist layer and the surface of the substrate, wherein the conductive layer formed on the second photoresist layer is separated from the metal layer formed on the first photoresist layer and the substrate surface. The first photoresist layer and the second photoresist layer are then removed, wherein the conductive layer formed on the second photoresist layer is concurrently striped, and the remaining conductive layer serves as a gate.

Thereafter, the pad layer is then patterned. Subsequent to the formation of a source/drain region on the surface of the substrate, a metal semiconductor field effect transistor is formed.

Since the T-shaped gate structure formed according to the present invention is not in a direct contact with the top surface of the pad layer, the generation of parasitic capacitance as in the conventional technique is thus prevented.

Further, in the fabrication method for a gate structure of the present invention, expensive and low yield manufacturing apparatus are precluded. The present invention thus provides a low cost and high yield manufacturing method for a gate structure.

Further, the gate electrode of the metal semiconductor field effect transistor of the present invention is a T-shaped gate electrode, which has a low resistance and no parasitic capacitance. The reliability and the operation efficiency of the device of the present invention are thereby desirable.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION

FIGS. 3A to 3H are schematic cross-sectional views showing a fabrication process flow for a field effect transistor according to one aspect of the present invention.

Figure 1A:
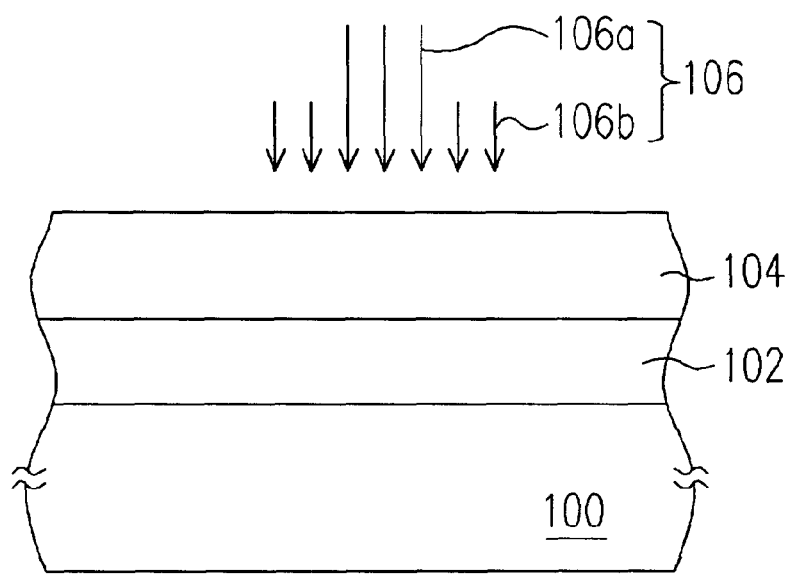
FIGS. 1A to 1D are schematic, cross-sectional diagrams illustrating a process flow for fabricating for a T-shaped gate structure according to the prior part.
Figure 1B:
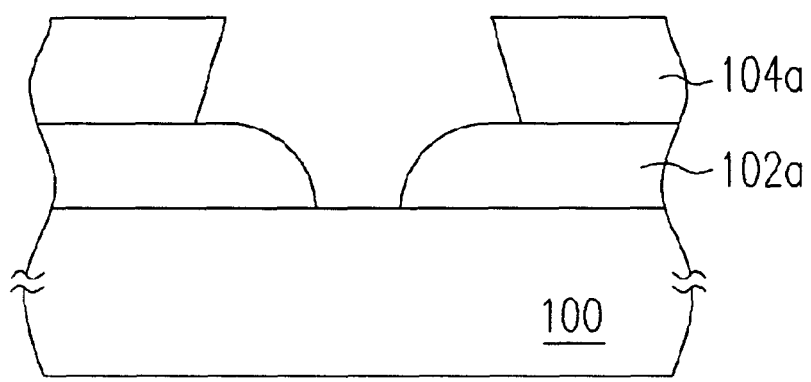
Figure 1C:
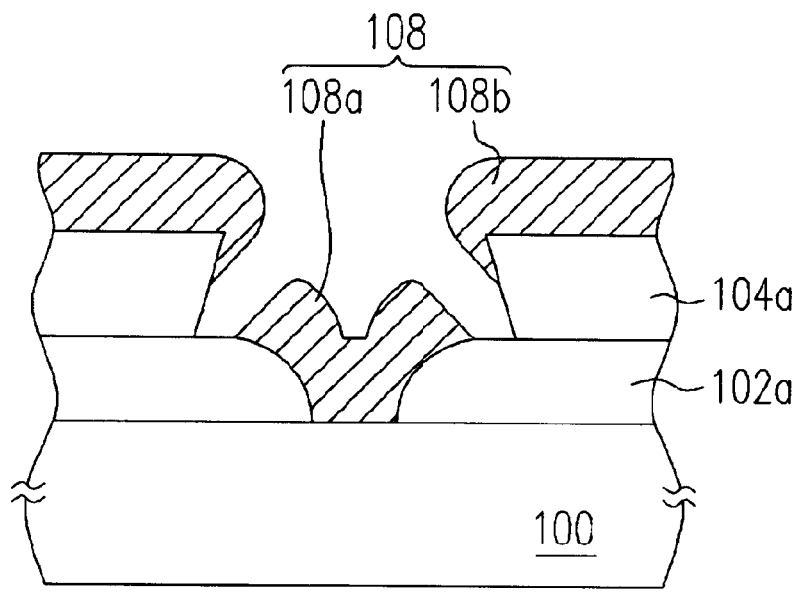
Figure 1D:
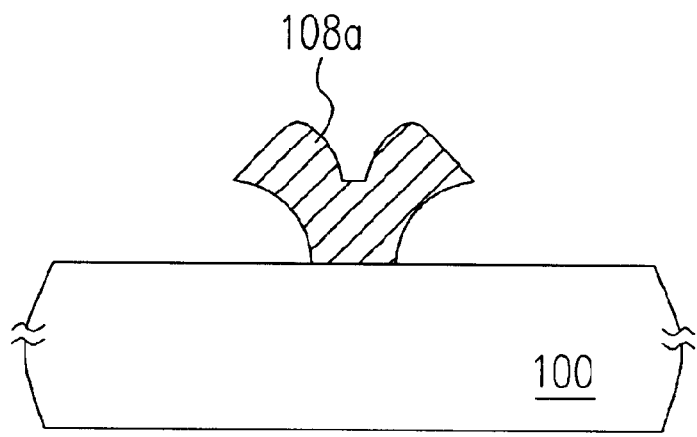
Figure 2A:
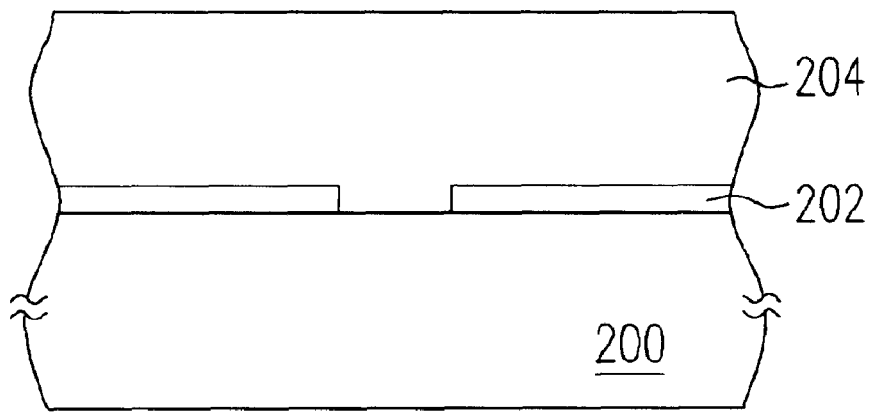
FIGS. 2A to 2D are schematic, cross-sectional diagrams illustrating a process flow for fabricating for a T-shaped gate structure according to another prior part.
Figure 2B:
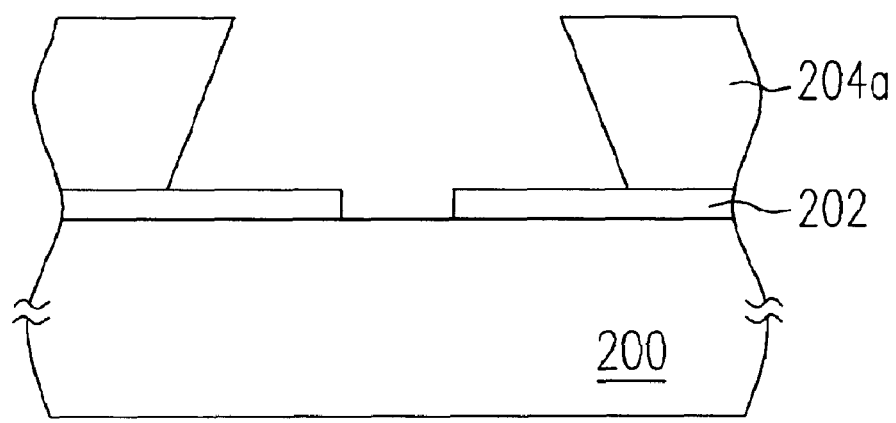
Figure 2C:
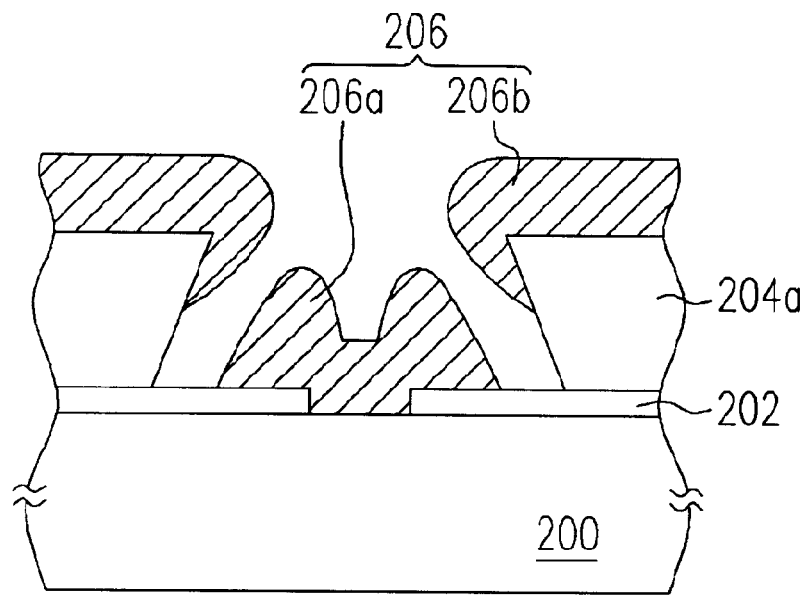
Figure 2D:
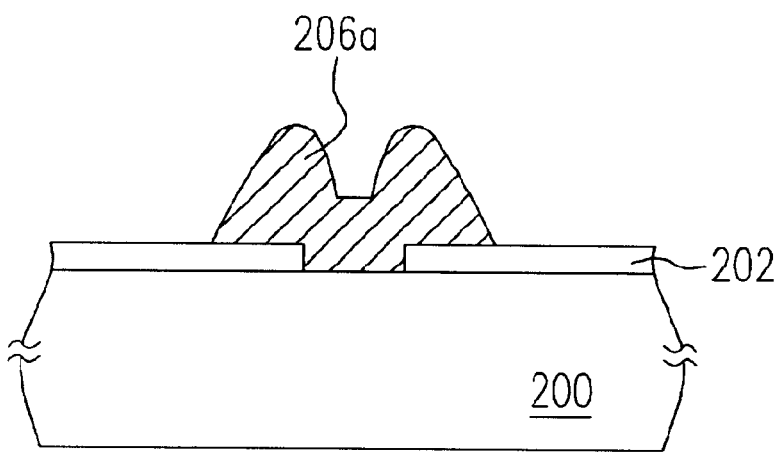
Figure 3A:
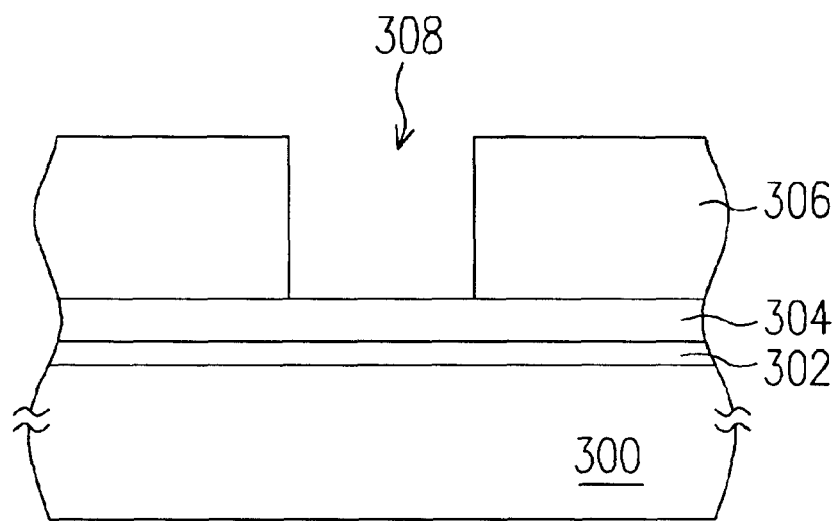
FIGS. 3A to 3H are schematic cross-sectional diagrams illustrating a process flow for fabricating a field effect transistor according to one aspect of the present invention.

Referring to FIG. 3A, a pad layer 302 is formed on a substrate 300, wherein the substrate is, for example, a gallium arsenate (GaAs) substrate, and the pad layer 302 is used to prevent the surface of the substrate from being damaged in the subsequent process. The pad layer 302 is about, for example, 500 angstrom to 2000 angstroms thick, preferably between 500 angstroms to 1000 angstroms thick. The pad layer 302 is formed with, for example, silicon nitride, silicon oxide, silicon oxynitride or other combination. Thereafter, an anti-reflection layer 304 and a photoresist layer 306 are sequentially formed on the pad layer 302, wherein the photoresist layer 306 comprises an opening 308, and the dimension of the opening 308 is determined according to the dimension of the subsequently formed gate structure.

Forming the anti-reflection layer 304 and the photoresist layer 306 includes, spin-coating a layer of an anti-reflection material (not shown) on the substrate 300 at a speed of 5500 rpm, and baking at a temperature 190 degrees Celsius for about 60 seconds to form the anti-reflection layer 304. Thereafter, a layer of photoresist material (not shown) is spin-coated on the anti-reflection layer 304 at a speed of 6000 rpm, followed by baking at a temperature of 100 degrees for 60 seconds. An exposure and development process is further conducted to form the photoresist layer 306 with an opening 308. The wavelength of the exposure light source used in the exposure process is, for example, 436 nm, 365 nm, 248 nm or 193 nm. The anti-reflection layer 304 is used to absorb the light that is not being absorbed by the photoresist material layer during the exposure process to prevent the generation of a standing wave. The anti-reflection layer 304 is about 700 angstroms to 900 angstroms thick. The anti-reflection layer 304 is, for example, an organic anti-reflection layer or an inorganic anti-reflection layer (for example, silicon nitride or silicon oxynitride). In this aspect of the invention, an organic anti-reflection layer is used for the illustration. The photoresist layer 306 is about, for example, 3000 angstroms to about 10000 angstroms thick. Further, the photoresist layer 306 can be a positive photoresist or a negative photoresist.

Figure 3B:
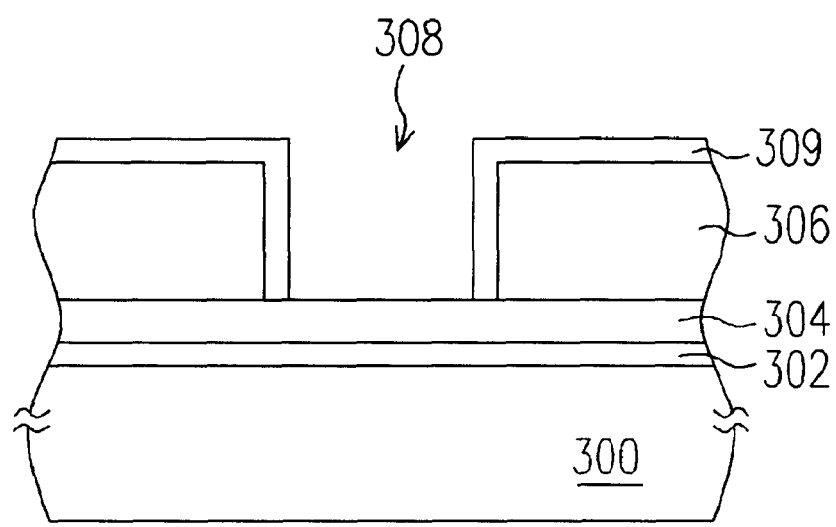

Referring to FIG. 3B, a cross-linked surface layer 309 is formed at the surface of the photoresist layer 306. The cross-linked surface layer 309 is a hard layer and is insensitive to the subsequent lithographic process. Forming the cross-linked surface layer 309 includes, for example, performing an UV curing treatment on the photoresist layer 306. Further, during the process of the UV curing treatment to form the cross-linked surface layer 309, the underlying photoresist layer 306 is prevented from being scratched and thus remains complete. In a preferred exemplary embodiment, the UV-curing treatment is conducted with energy of about, for example 200 mw/cm$^3$, at a temperature of about 100 degrees to 130 degrees Celsius. Further, the UV curing treatment is conducted for, for example, about 30 seconds to 60 seconds, wherein the duration of the treatment depends on the energy and the temperature of the UV curing treatment.

Figure 3C:
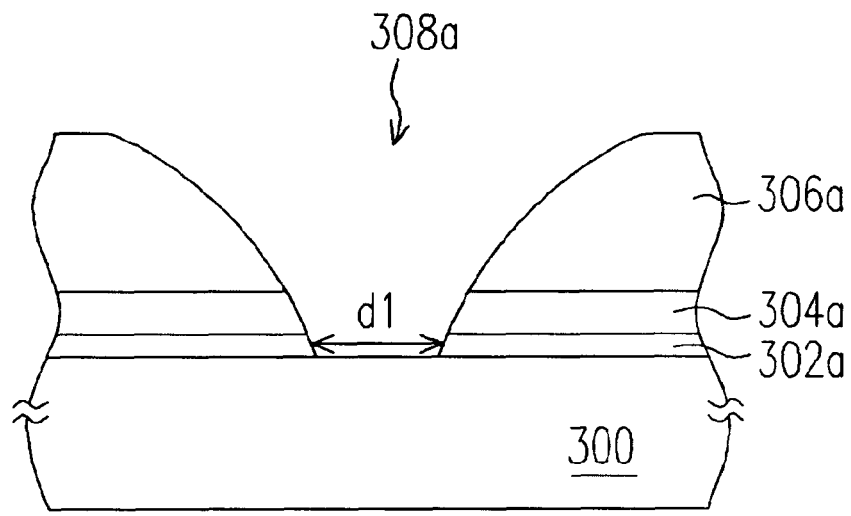

Referring to FIG. 3C, a rounding process is conducted to transform the original right angle profile of the photoresist layer 306a to a rounding profile. If the profile of the photoresist layer 306a is sufficiently rounded, the prevention of the generation of seam in the subsequently formed gate structure is enhanced. The above rounding step is achieved by, for example, conducting an ion-milling or a thermal flowing baking process, wherein the desirable rounding profile for the photoresist layer can be achieved by adjusting the injection angle of ions in the ion-milling process or by using a hot plate or an oven in the thermal flowing baking process.

Subsequent to the profile rounding of the photoresist layer 306a, the anti-reflection layer 304 and the pad layer 302 are etched to form a patterned anti-reflection layer 304a and a patterned pad layer 302a, and to form an opening 308a that exposes the substrate 300 surface, using the photoresist layer 306a as an etching mask. In one preferred exemplary embodiment, the anti-reflection layer 304 and the pad layer 302 are etched by, for example, using an ion coupled plasma etching apparatus and an oxygen gas as a reaction gas to etch the anti-reflection layer 304, followed by etching the pad layer 302.

One point that is worth mentioning is that the dimension d1 of the opening 308a that exposes the substrate 300 surface is the critical dimension of the subsequently gate structure. Therefore, during the etching process of the pad layer 302, the dimension d1 can be adjusted to achieve the expected target dimension.

Figure 3D:
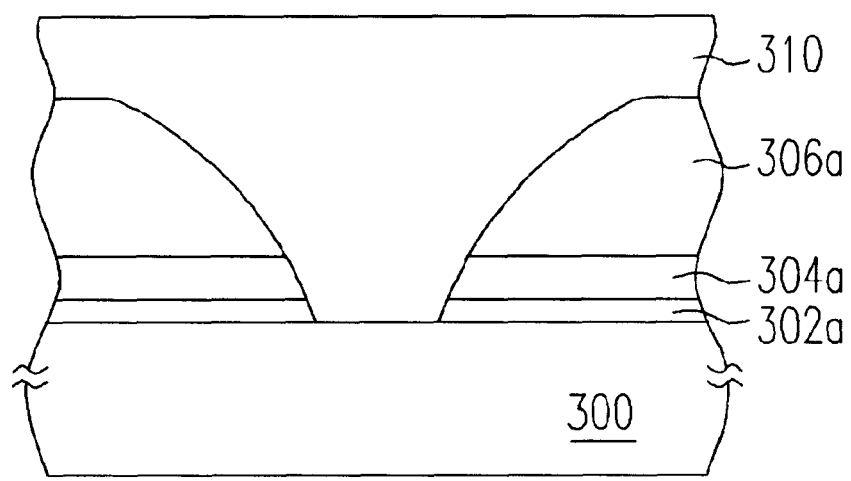

Referring to FIG. 3D, a photoresist layer 310 is formed above the substrate 300, covering the photoresist layer 306a and filling the opening 308a. The photoresist layer 310 can be a positive photoresist or a negative photoresist. The photoresist layer 310 is formed by, for example, spin-coating a layer of photoresist material (not shown) at a speed of 2000 rpm, followed by baking at 90 degrees Celsius for about 60 seconds to form the photoresist layer 310 of about 10000 angstroms to about 25000 angstroms thick.

Figure 3E:
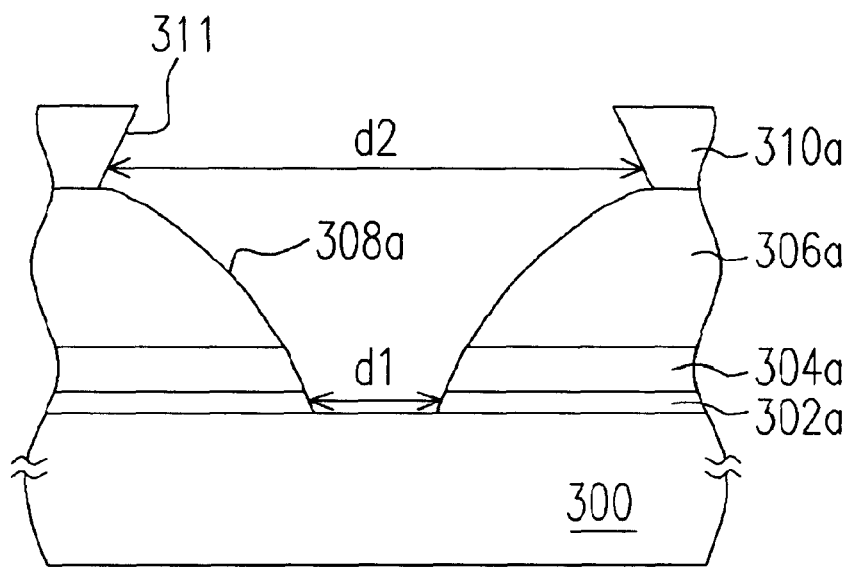

Continuing to FIG. 3E, an exposure and development process is conducted to pattern the photoresist layer 310 to form a photoresist layer 310a with an opening 311, wherein the opening 311 corresponds to where the opening 308a is previously formed. Further, the dimension (width) d2 of the opening 311 is greater than the dimension (width) d1 of the opening 308a that exposes the substrate 300 surface. Preferably, the dimension d2 of the opening 311 is least twice as big as the dimension d1 of the opening 308a that exposes the substrate 300 surface. As a result, a portion of the photoresist layer 306a and the substrate 300 surface are exposed by the opening 311.

More particularly, the photoresist layer 310a is formed having an opening 311, wherein the sidewall of the opening 311 and the sidewall of the opening 308a forms an acute angle. To form the opening 311 of the photoresist layer 310, wherein the sidewall of the opening 311 and the sidewall of the opening 308a forms an acute angle includes using a negative photoresist as a material for the photoresist layer 310 to perform the exposure and development process or using an image reverse (IR) photoresist as a material for the photoresist layer 310 to perform the exposure and development process, or using a positive photoresist as a material for the photoresist layer 310 to perform the exposure and development process after a special treatment step.

Figure 3F:
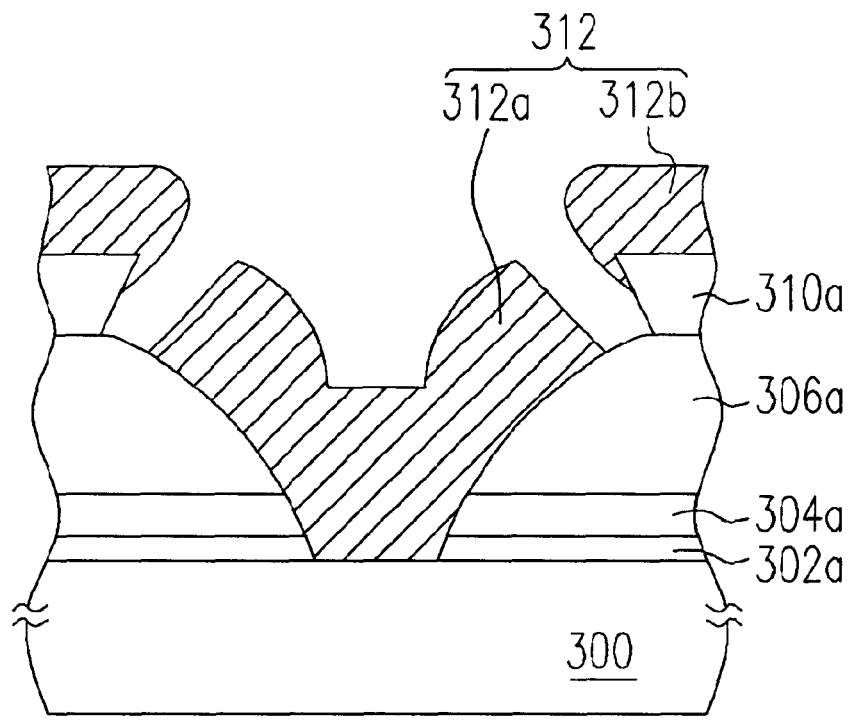

Referring to FIG. 3F, a metal layer 312 is formed on the photoresist layer 310a, the photoresist layer 306a and the substrate 300 surface, wherein the metal layer 312 can be any known, appropriate metal material. The metal layer 312 is formed by, preferably, a directional deposition method, for example, an evaporation deposition method, a sputtering method, an electroplating method. Since the sidewall of the opening 311 and the sidewall of the opening 308a forms an acute angle, the metal layer 312b formed on the surface of the photoresist layer 310a by an evaporation method is not connected to the metal layer 312a formed on the photoresist layer 306a and the substrate 300 surface. In fact, the metal layer 312b is separated from the metal layer 312a.

In a preferred exemplary embodiment, the evaporation deposition method includes performing a descum step, which is a descum using an oxygen plasma for about two minutes under a power source of 1000 watts and a pressure of 0.5 torr, followed by wetting with an acid and water (1:20) mixture solution for 20 seconds, and then drying for 30 seconds with air. A metal evaporation deposition step is then conducted to form a metal layer 312, wherein the metal layer 312 includes titanium of 250 angstroms thick, platinum of 250 angstroms thick and gold of 5000 angstroms thick.

Figure 3G:
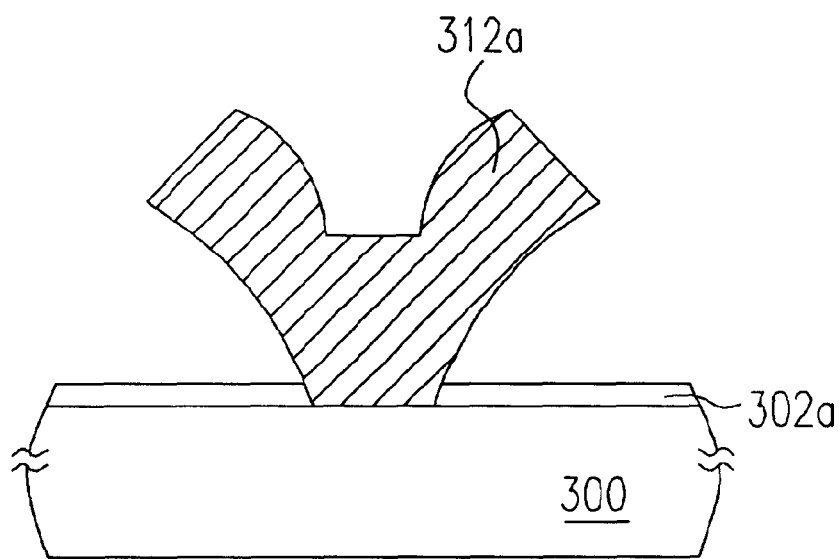

Referring to FIG. 3G, the photoresist layer 310a, the photoresist layer 306a and the anti-reflection layer 304a are removed. Further, the metal layer 312b is concurrently striped to expose the pad layer 302a. Removing the photoresist layers 310a, 306a and the anti-reflection layer 304a includes, for example, using a wet etching method. Since the metal layer 312b formed on the surface of the photoresist layer 310a is separated from the metal layer 312a, the metal layer 312b is also being striped during the removal of the photoresist layers 310a, 306a and the anti-reflection layer 304a, leaving only the metal layer 312a to form the gate structure of the present invention. Further, the gate structure of the present invention will not be in direct contact with the top surface of the pad layer 302a.

Figure 3H:
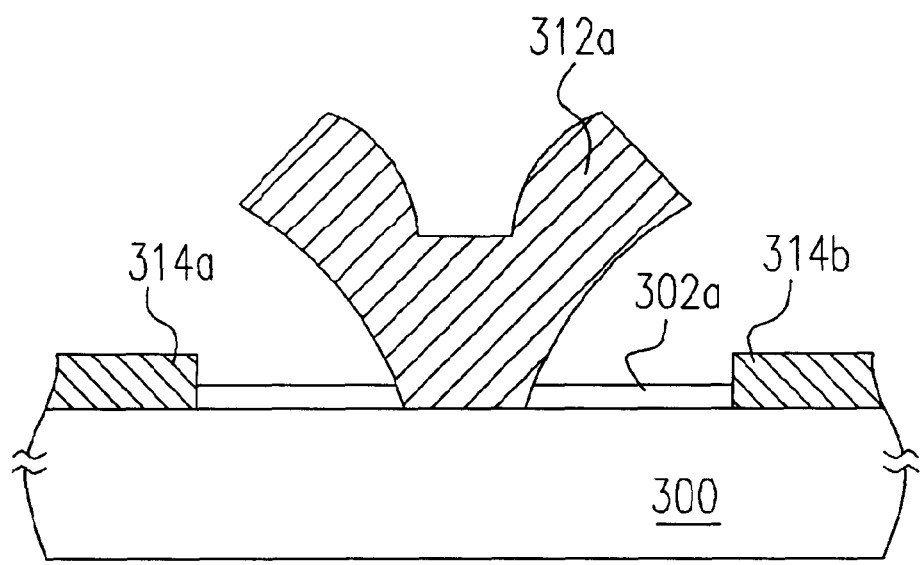

Continuing to FIG. 3H, the pad layer 302a is patterned to form the pad layer 302b, and a source region/drain region 314a/314b is then formed on the substrate 300 to complete a fabrication of a transistor. The source/drain region 314a/314b is formed with, for example, a metal material.

Using the aforementioned method for fabricating a transistor, when the gate length is about 0.35 micron, the average value for the cutoff frequency, detected by Vp-1.0 volt, is about 38±2 GHz.

In accordance to the fabrication method for the present invention, since the T-shaped gate structure of the present invention is not in a direct contact with the top surface of the pad layer, the generation of parasitic capacitance as in the prior art is prevented.

Further, in the fabrication method for a gate structure of the present invention, expensive and low yield manufacturing apparatus are precluded. The present invention thus provides a low cost and a high yield fabrication method.

Since, the gate of the field effect transistor of the present invention is a T-shaped gate structure that has a low resistance, the generation of parasitic capacitance is obviated to ensure the reliability and the efficiency of the device.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A fabrication method for a gate structure, comprising:
   forming a pad layer on a surface of a substrate;
   forming a patterned first photoresist layer on the pad layer, wherein the patterned first photoresist layer comprises a first opening that exposes the pad layer;
   forming a cross-linked surface layer at the surface of the first photoresist layer;
   performing a rounding step for rounding a profile of the first photoresist layer;
   removing the pad layer not covered by the first photoresist layer to expose the surface of the substrate;
   forming a patterned second photoresist layer on the first photoresist layer, wherein the second photoresist layer comprises a second opening that exposes a part of the first photoresist layer and the surface of the substrate that is being exposed by the first photoresist layer;
   performing a deposition step to form a conductive layer on the second photoresist layer, the first photoresist layer and the surface of the substrate, wherein a part of the conductive layer formed on the second photoresist layer is separated from a part of the conductive layer formed on the first photoresist layer and the surface of the substrate; and
   removing the first photoresist layer and the second photoresist layer, and concurring stripping the part of the conductive layer formed on the second photoresist layer.

2. The method of claim 1, wherein forming the cross-linked surface layer on the surface of the first photoresist layer comprises performing an ultra-violet curing step.

3. The method of claim 1, wherein the rounding step comprises performing an ion-milling step or a thermal flowing baking step.

4. The method of claim 1, wherein the deposition step comprises performing an evaporation step, a sputtering step or an electroplating step.

5. The method of claim 1, wherein before forming the first photoresist layer, the method further comprises forming an anti-reflection layer on a surface of the pad layer.

6. The method of claim 1, wherein the pad layer is formed with a material selected from the group consisting of silicon nitride, silicon oxide and silicon oxynitride.

7. The method of claim 1, wherein a width of the second opening that exposes the first photoresist layer and the substrate surface is at least two times a width of the first opening that exposes the substrate surface.

8. The method of claim 1, wherein a sidewall of the second opening and a sidewall of the first opening form an acute angle.

9. The method of claim 1, wherein a wavelength of an exposure light source used in the patterning of the first photoresist layer is 436 nm, 365 nm, 248 nm or 193 nm.

10. A fabrication method for a field effect transistor, the method comprising:

forming a pad layer on a surface of a substrate;

forming a patterned first photoresist layer on the pad layer, wherein the patterned first photoresist layer comprises a first opening that exposes the pad layer;

forming a cross-linked surface layer on a surface of the first photoresist layer;

performing a rounding process for rounding a profile of the first photoresist layer;

removing the pad layer not covered by the first photoresist layer to expose the surface of the substrate;

forming a patterned second photoresist layer on the first photoresist layer, wherein the second photoresist layer comprises a second opening that exposes the substrate surface being exposed by the first photoresist layer and a part of the first photoresist layer;

performing a metal deposition step to form a metal layer on the second photoresist layer, the first photoresist layer and the surface of the substrate, wherein a part of the metal layer formed on the second photoresist layer is separated from a part of the metal layer formed on the first photoresist layer and the surface of the substrate;

removing the first photoresist layer, the second photoresist layer, and concurrently stripping the part of metal layer on the second photoresist layer, leaving the part of the metal layer formed on the surface of the substrate as a gate;

patterning the pad layer to expose the surface of the substrate; and forming a source/drain region on the surface of the substrate.

11. The method of claim 10, wherein forming the cross-linked surface layer on the surface of the first photoresist layer comprises performing an ultra-violet curing step.

12. The method of claim 10, wherein the rounding step comprises performing an ion-milling step or a thermal flowing baking step.

13. The method of claim 10, wherein the metal deposition step comprises a metal evaporation step, a metal sputtering step or a metal electroplating step.

14. The method of claim 10, wherein before forming the first photoresist layer, the method further comprises forming an anti-reflection layer on a surface of the pad layer.

15. The method of claim 10, wherein the pad layer is formed with a material selected from the group consisting of silicon nitride, silicon oxide and silicon oxynitride.

16. The method of claim 10, wherein a width of the second opening that exposes the first photoresist layer and the substrate surface is at least two times a width of the first opening that exposes the substrate surface.

17. The method of claim 10, wherein a sidewall of the second opening and a sidewall of the first opening form an acute angel.

18. The method of claim 10, wherein a material in forming the source/drain region comprises a metal material.

19. The method of claim 10, wherein a wavelength of an exposure light source used in the patterning of the first photoresist layer is 436 nm, 365 nm, 248 nm or 193 nm.

* * * * *